(12) United States Patent
Lam et al.

(10) Patent No.: US 10,244,631 B2
(45) Date of Patent: Mar. 26, 2019

(54) HYBRID FABRICATION METHOD FOR LARGE AREA MICROWAVE CIRCUITS

(71) Applicant: The Boeing Company, Chicago, IL (US)

(72) Inventors: Tai Anh Lam, Renton, WA (US); Jean Ann Nielsen, Kent, WA (US); Minas H. Tanielian, Bellevue, WA (US)

(73) Assignee: THE BOEING COMPANY, Chicago, IL (US)

(*) Notice: Subject to any disclaimer, the term of this patent is extended or adjusted under 35 U.S.C. 154(b) by 218 days.

(21) Appl. No.: 14/832,462

(22) Filed: Aug. 21, 2015

(65) Prior Publication Data
US 2017/0055342 A1    Feb. 23, 2017

(51) Int. Cl.
*H05K 1/14*    (2006.01)

(52) U.S. Cl.
CPC ....... *H05K 1/141* (2013.01); *H05K 2201/041* (2013.01); *H05K 2201/099* (2013.01); *H05K 2201/09563* (2013.01); *H05K 2201/10098* (2013.01); *H05K 2201/10166* (2013.01)

(58) Field of Classification Search
CPC .............................. H05K 1/0237; H05K 1/141
See application file for complete search history.

(56) References Cited

U.S. PATENT DOCUMENTS

| | | | | |
|---|---|---|---|---|
| 5,629,241 | A  * | 5/1997 | Matloubian | H01L 23/66 228/180.22 |
| 6,607,934 | B2 * | 8/2003 | Chang | B81C 1/00246 438/119 |
| 6,858,892 | B2 * | 2/2005 | Yamagata | H01L 23/50 257/300 |
| 6,946,322 | B2 * | 9/2005 | Brewer | H01L 21/6835 257/777 |
| 7,348,842 | B2 * | 3/2008 | Ichitsubo | H01L 23/66 257/E25.03 |
| 7,501,915 | B2 * | 3/2009 | Murata | H05K 1/16 333/172 |
| 8,148,793 | B2 * | 4/2012 | Liu | B81B 7/0077 257/415 |
| 2004/0077124 | A1* | 4/2004 | Ogawa | H01L 21/4857 438/106 |
| 2005/0151215 | A1* | 7/2005 | Hauhe | H01Q 21/0025 257/421 |

* cited by examiner

*Primary Examiner* — Nathan Milakovich
(74) *Attorney, Agent, or Firm* — MH2 Technology Law Group LLP

(57) ABSTRACT

A microwave device can include a printed circuit board substrate having a first microwave device subcircuit and a microdevice substrate having a second microwave device subcircuit. The first microwave device subcircuit may be formed at a low resolution and a low tolerance, while the second microwave device subcircuit may be formed at a high resolution and a high tolerance. The first microwave device subcircuit and the second microwave device subcircuit may be electrically coupled using a conductor.

18 Claims, 2 Drawing Sheets

HYBRID FABRICATION METHOD FOR LARGE AREA MICROWAVE CIRCUITS

FIELD

The present teachings relate to the field of microwave circuits and, more particularly, to a structure and fabrication method for a microwave circuit, for example, a large-area microwave circuit.

BACKGROUND

Microwave frequencies are commonly used for the transmission of data and telecommunications in both ground-based and space-based systems, as well as other uses. Microwave systems include the use of a transmitter, an antenna to radiate the microwave signal, and a receiver. The transmitter generates a transmission wave of a particular frequency and outputs a narrow beam at microwave frequencies from the antenna, which is then intercepted by the receiver.

While telecommunications and other microwave signal uses have most commonly employed the use of microwave frequencies of from 1 gigahertz (GHz) to 30 GHz, technology improvements may allow for the use higher frequency waves, for example, at 44 GHz, 77 GHz, 94 GHz, and higher. However, to enable these higher frequency microwave signals, transmitter and receiver hardware must be formed to more strict design tolerances.

Microwave circuitry for use in telecommunications is typically formed as a multilayered printed circuit board (PCB) using conventional PCB fabrication techniques. The PCB's may be up to several feet in width, a perimeter of over 100 inches, and have an area of several hundred square inches (in$^2$), or over 1,000 in$^2$. Each microwave circuit substructure, for example, one or more filters, resonators, inductors, etc., is formed using conductive lines (e.g., conductive interconnects) on the PCB and discrete components such as capacitors, diodes, relays, etc., attached to the PCB using a conductor such as solder or a conductive paste. The conductive lines may be formed from a metal layer that is chemically etched using an acid.

While wafer microfabrication techniques using, for example, photolithographic processes can form circuitry having the required dimensions and tolerances, device sizes are limited by present technology to maximum wafer dimensions. For example, while silicon semiconductor wafers presently have a maximum diameter of about 300 millimeters (mm), microwave PCB's may have a required size of several feet in width. Further, contract manufacturers may be limited to less than maximum wafer sizes, for example, to 125 mm wafers. Additionally, wafer fabrication is expensive and requires costly manufacturing equipment and cleanroom environments.

SUMMARY

The following presents a simplified summary in order to provide a basic understanding of some aspects of one or more embodiments of the present teachings. This summary is not an extensive overview, nor is it intended to identify key or critical elements of the present teachings, nor to delineate the scope of the disclosure. Rather, its primary purpose is merely to present one or more concepts in simplified form as a prelude to the detailed description presented later.

In an embodiment, a microwave device can include a printed circuit board structure that includes a printed circuit board substrate having a circuit side, and a first microwave device subcircuit on the circuit side of the printed circuit board substrate. The microwave device can further include a passive microwave microdevice that includes a microdevice substrate having a passive layer side and a second microwave device subcircuit on the passive layer side of the microdevice substrate. The microwave device can further include an electrical conductor that electrically couples the first microwave device subcircuit to the second microwave device subcircuit. The first microwave device subcircuit can include a first subcircuit type selected from the group consisting of a filter, a resonator, a capacitor, an inductor, an impedance transformer, an impedance tuning element, a phase shifter, a power divider, a power coupler, and an air bridge structure and the second microwave device subcircuit includes a second subcircuit type selected from the group consisting of a filter, a resonator, a capacitor, an inductor, an impedance transformer, an impedance tuning element, a phase shifter, a power divider, a power coupler, and an air bridge structure, wherein the first subcircuit type is different from the second subcircuit type.

The first microwave device subcircuit device may have a minimum feature dimension of from 25 micrometers to 1,000 micrometers, while the second microwave device subcircuit may have a minimum feature dimension of from 10 nanometers to 25 micrometers. The passive microwave microdevice may be a first passive microwave microdevice, and the microwave device may further include a second passive microwave microdevice, wherein the second passive microwave microdevice includes a microdevice substrate having a passive layer side and a third microwave device subcircuit on the passive layer side of the microdevice substrate of the second passive microwave microdevice, wherein the third microwave device subcircuit includes a third subcircuit type selected from the group consisting of a filter, a resonator, a capacitor, an inductor, an impedance transformer, an impedance tuning element, a phase shifter, a power divider, a power coupler, and an air bridge structure. The third subcircuit type may be different from the first subcircuit type and the second subcircuit type. The electrical conductor can include a material selected from the group consisting of solder and a heat-curable conductive paste.

The microwave device may be configured to output a microwave signal having a frequency of 44 GHz or greater. The printed circuit board substrate can include a dielectric resin and the microdevice substrate can include a semiconductor. In an embodiment, the microdevice substrate may further include a reverse side opposite the passive layer side, and the microwave device may further include a plurality of through-holes through the microdevice substrate that extend from the passive layer side to the reverse side and a plurality of conductive plugs, wherein each of the plurality of conductive plugs is within one through-hole of the plurality of through-holes. The electrical conductor may be electrically coupled with each conductive plug of the plurality of conductive plugs. In an embodiment, the printed circuit board structure can include at least one transistor as an active device, while the passive microwave microdevice is free from transistors and other active devices.

In another embodiment, a method for forming a microwave device can include attaching a printed circuit board substrate including a circuit side and a first microwave device subcircuit on the circuit side of the printed circuit board substrate to a passive microwave microdevice including a microdevice substrate having a passive layer side and a second microwave device subcircuit on the passive layer side of the microwave substrate with an electrical conductor that electrically couples the first microwave device subcircuit to the second microwave device subcircuit.

The method can further include selecting the first microwave device subcircuit to include a first subcircuit type selected from the group consisting of a filter, a resonator, a capacitor, an inductor, an impedance transformer, an impedance tuning element, a phase shifter, a power divider, a power coupler, and an air bridge structure, and selecting the second microwave device subcircuit to include a second subcircuit type selected from the group consisting of a filter, a resonator, a capacitor, an inductor, an impedance transformer, an impedance tuning element, a phase shifter, a power divider, a power coupler, and an air bridge structure, wherein the first subcircuit type selected is different from the second subcircuit type selected.

The method can further include forming the first microwave device subcircuit device to include a minimum feature dimension of from 25 micrometers to 1,000 micrometers, and forming the second microwave device subcircuit to include a minimum feature dimension of from 10 nanometers to 25 micrometers.

In an embodiment, the passive microwave microdevice may be a first passive microwave microdevice and the method may further include attaching the printed circuit board substrate to a second passive microwave microdevice including a microdevice substrate having a passive layer side and a third microwave device subcircuit on the passive layer side of the second passive microwave microdevice with the electrical conductor that electrically couples the first microwave device subcircuit to the third microwave device subcircuit.

The method can further include selecting the third microwave device subcircuit to include a third subcircuit type selected from the group consisting of a filter, a resonator, a capacitor, an inductor, an impedance transformer, an impedance tuning element, a phase shifter, a power divider, a power coupler, and an air bridge structure, wherein the third subcircuit type selected is different from the first subcircuit type selected and the second subcircuit type selected.

An embodiment can also include selecting the electrical conductor to include a material selected from the group consisting of solder and a heat-curable conductive paste, as well as configuring the microwave device to output a microwave signal having a frequency of 44 GHz or greater.

An embodiment may further include selecting the printed circuit board substrate to include a dielectric resin, and selecting the microdevice substrate to include a semiconductor. The microdevice substrate may further includes a reverse side opposite the passive layer side, while the method further includes forming a plurality of through-holes through the microdevice substrate that extend from the passive layer side to the reverse side, forming a plurality of conductive plugs within the plurality of through-holes, and electrically coupling the plurality of conductive plugs to the first microwave device subcircuit using the electrical conductor.

The electrical conductor can be selected to include a material selected from the group consisting of solder and a heat-curable conductive paste. The method may further include forming the first microwave device subcircuit using a method selected from the group consisting of chemical etching of a blanket conductive layer, mechanical etching of a blanket conductive layer, a three dimensional printing process, and a direct writing process.

DRAWINGS

The accompanying drawings, which are incorporated in and constitute a part of this specification, illustrate embodiments of the present teachings and together with the description, serve to explain the principles of the disclosure. In the figures.

It should be noted that some details of the FIGS. have been simplified and are drawn to facilitate understanding of the present teachings rather than to maintain strict structural accuracy, detail, and scale.

DESCRIPTION

Reference will now be made in detail to exemplary embodiments of the present teachings, examples of which are illustrated in the accompanying drawings. Wherever possible, the same reference numbers will be used throughout the drawings to refer to the same or like parts.

As discussed above, microwave circuitry for use in telecommunications is typically formed as a multilayered printed circuit board (PCB) using conventional PCB fabrication techniques. The PCB's may be up to several feet in width. While the use of a chemical etch process is sufficient to form conductive lines and other circuitry on the PCB for microwave frequencies below 30 GHz, supporting circuitry for higher-frequency microwave transmissions will require smaller line widths, tighter tolerances, and a lower surface roughness than PCB fabrication techniques can provide. An embodiment of the present teachings may allow for a large-scale microwave device having the necessary area, width, length, and perimeter, which also has circuitry that may be formed with sizes and tolerances that allow the microwave device to output a microwave signal having a frequency of over 30 GHz, or 44 GHz or greater, or 94 GHz or greater.

Figure 1:
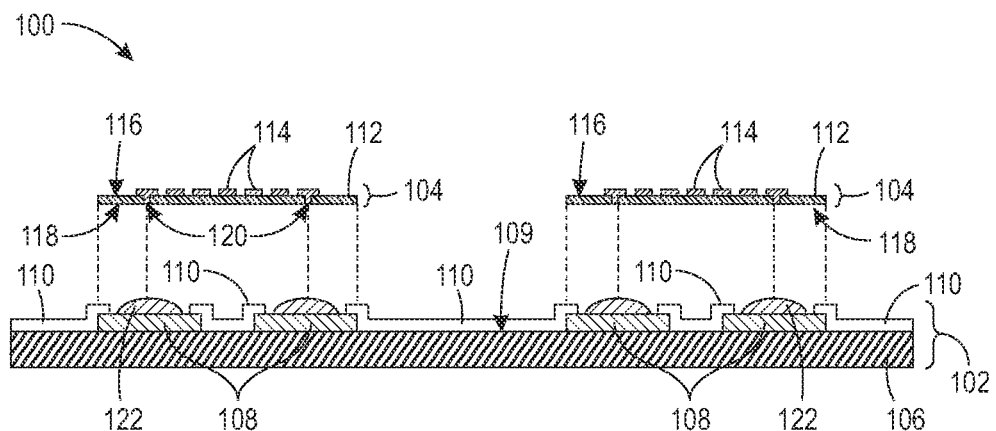
FIG. 1 is an exploded cross section of a microwave device in accordance with an embodiment of the present teachings.
Figure 2:
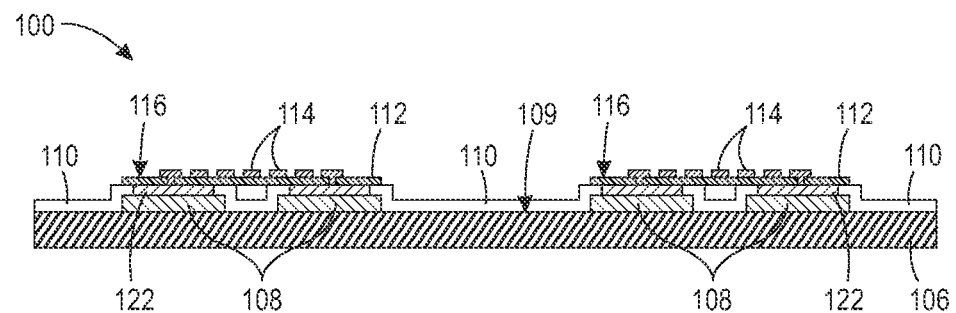
FIG. 2 is an assembled cross section of the FIG. 1 microwave device.

FIG. 1 is an exploded view, and FIG. 2 is an assembled view, of in-process structures that can be formed during an embodiment of the present teachings. FIG. 1 depicts a microwave device 100 including a PCB structure 102 and at least one passive microwave microdevice (hereinafter, "PMM") 104. The PCB structure 102 can include a PCB substrate 106 manufactured from, for example, a dielectric resin or other suitable material in accordance with PCB fabrication techniques. The PCB structure 102 can further include PCB circuitry 108, for example a plurality of spaced lines, pads, and/or interconnects that are formed on a circuit side 109 of the PCB substrate 106 from an electrically conductive material, for example, a metal such as copper or aluminum, a metal alloy, or another suitable material. The PCB circuitry 108 may provide one or more active and/or passive microwave device subcircuits. The PCB structure 102 may further include a dielectric mask 110, for example a dielectric solder mask.

The microwave PCB structure 102 may be formed using known manufacturing techniques. The PCB circuitry 108 may have, for example, line widths, line pitches, and other circuit dimensions that result from known PCB manufacturing techniques, for example, chemical or mechanical etching of a blanket conductive layer. Alternatively, PCB circuitry 108 may be fabricated using a three dimensional (3D) printing process, a direct writing process, or, in general, any additive manufacturing process.

Another embodiment may include printing, direct writing, and/or additive manufacturing (3D) printing of the PCB circuitry 108 on curved and conformal dielectric surfaces where only coarse line widths are possible. For example, the PCB substrate may be a dielectric surface such as carbon fiber, wood, natural and/or synthetic composites, etc.

FIGS. 1 and 2 depict two PMM's 104, including a first PMM and a second PMM. The first PMM 104 may be the same or different than the second PMM 104. The one or more PMM's 104 can include a microdevice substrate 112 and microdevice circuitry 114. The microdevice substrate 112 can include a semiconductor material, for example, silicon, gallium arsenide, or another semiconductor. The microdevice substrate 112 may be a section of a semiconductor wafer substrate assembly fabricated using wafer fabrication techniques. The microdevice circuitry 114 may provide at least one microdevice subcircuit on each PMM 104, and may be provided by one or more electrically conductive patterned layers. The microdevice circuit layer 114 may have, for example, line widths, line pitches, and other circuit dimensions that result from known microchip manufacturing techniques, for example optical photolithographic techniques. The microdevice circuit layer 114 may be formed on a passive layer side 116 of the microdevice substrate 112 opposite a reverse side 118 that is opposite the passive layer side.

The microdevice circuit layer 114 of each PMM 104 includes only passive circuitry and passive devices, such as one or more antennas, resonators, and/or filters. The microdevice circuit layer 114 of each PMM 104 does not include active circuitry or active devices, such as transistors and devices that include one or more transistors as a circuit component. In other words, while the printed circuit board structure can include at least one transistor as an active device, the passive microwave microdevice is free from transistors and other active devices. Thus, while the microwave circuit layer 114 may be formed using microfabrication techniques such as photolithography, the microwave circuit layer 114 does not include active circuitry such as is found in integrated circuits such as microprocessors, field-effect transistors, etc. The microwave circuit layer 114 will not typically include impurity doping, which would be indicative of an active circuit, unless the impurity doping is used for enhanced operation of the passive circuitry of the PMM 104.

In FIG. 2, the PMM's 104 have been both physically and electrically attached to the PCB structure 102. In an embodiment, the microdevice substrate 112 may include one or more vias 120. Each via 120 may include a through-hole that extends through the microdevice substrate 112 from the passive layer side 116 to the reverse side 118. Each through-hole may be filled with a conductive plug or stud as depicted. In an embodiment, the vias 120, and more particularly the conductive plugs, are placed in physical and electrical contact with a conductor 122, for example a flowable conductor, that is in physical contact with the PCB circuitry 108. The conductor 122 may then be heated and flowed, then cooled, to facilitate physical and electrical attachment to the vias 120 and to the microdevice circuit layer 114. The conductor 122 may be solder, a heat-curable conductive paste, or another conductor that electrically couples the microdevice subcircuit to the PCB subcircuit. Further, other attachment techniques are contemplated, for example, flip-chip attachment techniques, ball grid array (BGA) attachment techniques, wire bonding techniques, or another suitable attachment technique. The attached PCB structure 102 and the PMM's 104 of FIG. 1 are attached to form a completed microwave device 100 as depicted in FIG. 2. In an embodiment, each PMM 104 may be attached to the PCB structure 102 using a pick-and-place apparatus.

A microwave device may include various subcircuits formed as a part of the PCB 102 or the one or more PMM's 104. The subcircuits may include one or more microwave resonators, filters, capacitors, inductors, impedance transformers, impedance tuning elements, phase shifters, power dividers, power couplers, air bridge structures, etc. Each of these subcircuits may be formed on one or more of the PCB substrate 106 as part of the PCB structure 102, or on the microdevice substrate 112 as part of the one or more PMM's 104. The subcircuits on the PCB 102 and the one or more PMM's 104 may be the same or different from the others. The particular microwave device circuits designed for inclusion as part of the PCB structure 102 and/or the PMM 104 may be based on the tolerances and sizes required to provide a functional high-frequency microwave device. Together, the fine circuit substructures having a relatively small size, a high resolution, and a more precise design tolerance on the PMM 104 and the coarse circuit substructures having a relatively large size, low resolution, and less precise design tolerance on the PCB 106 form a complete microwave device. Because the microwave device 100 is formed using both PCB fabrication techniques and microchip fabrication techniques, the microwave device 100 is referred to herein as a "hybrid" device.

In an embodiment, the PCB structure 102 may be formed to have a minimum feature dimension of from about 25 micrometers (μm) to about 1,000 μm, or from about 50 μm to about 1,000 μm or greater. The PMM may be formed to have a minimum feature dimension of from about 10 nanometers (nm) to about 25 μm, or from about 10 nm to about 20 μm.

Figure 3:
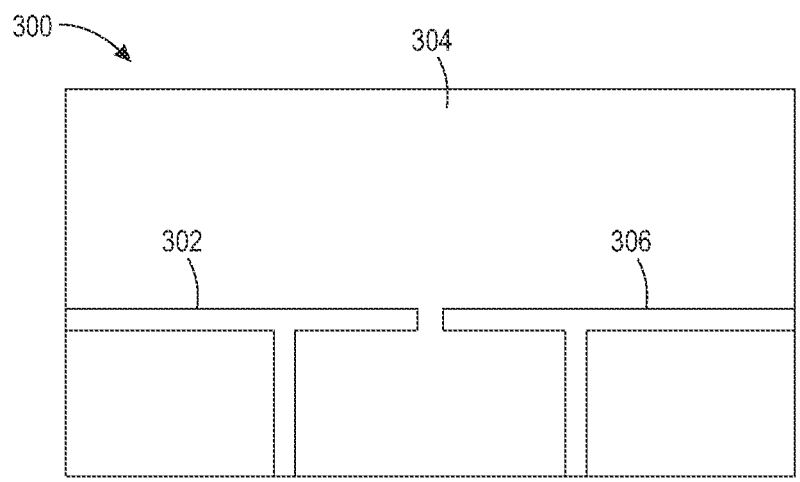
FIG. 3 is a plan view of a printed circuit board for a microwave device.

FIG. 3 is a plan view depicting a PCB 300 including a first conductive line 302 formed on a surface 304 of the PCB 300, and a second conductive line 306 formed on the surface 304 of the PCB 300. The surface 304 of the PCB 300 may have a footprint that encloses an area of, for example, about 0.5 square feet ($ft^2$) or larger, or from about 1 $ft^2$ to about 80 $ft^2$, or larger than about 80 $ft^2$. The PCB 300 may be formed using, for example, one or more chemical etch processes to form the conductive lines 302, 306 over a dielectric substrate surface 304.

Figure 4:
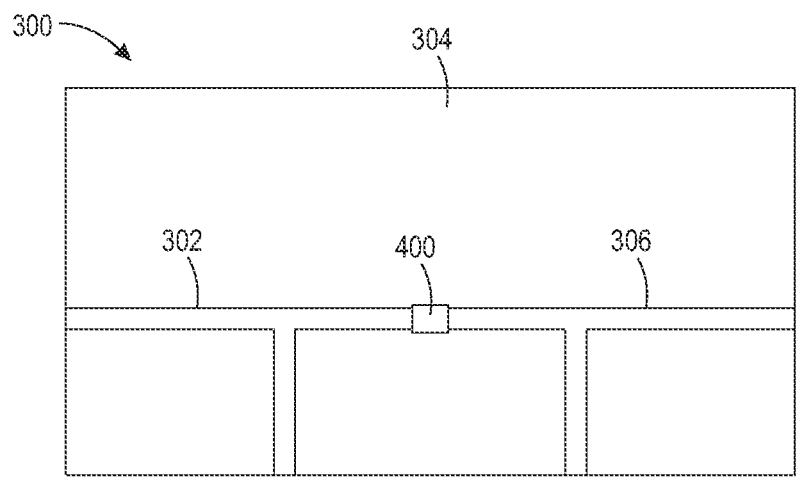
FIG. 4 is a plan view of the printed circuit board of FIG. 3 and a passive microwave microdevice attached thereto in accordance with an embodiment of the present teachings.

FIG. 4 is a plan view depicting a PMM 400 attached to the PCB 300 of FIG. 3, for example, as described above with reference to FIGS. 1 and 2. The PMM 400 may have a footprint that encloses an area of, for example, about 5 $mm^2$ or less, or about 1 $mm^2$ or less. The one or more PMM's 400 may be formed using, for example, semiconductor wafer fabrication techniques.

Notwithstanding that the numerical ranges and parameters setting forth the broad scope of the present teachings are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less than 10" can assume negative values, e.g. −1, −2, −3, −10, −20, −30, etc.

While the present teachings have been illustrated with respect to one or more implementations, alterations and/or modifications can be made to the illustrated examples without departing from the spirit and scope of the appended claims. For example, it will be appreciated that while the process is described as a series of acts or events, the present teachings are not limited by the ordering of such acts or events. Some acts may occur in different orders and/or concurrently with other acts or events apart from those described herein. Also, not all process stages may be required to implement a methodology in accordance with one or more aspects or embodiments of the present teachings. It will be appreciated that structural components and/or processing stages can be added or existing structural components and/or processing stages can be removed or modified. Further, one or more of the acts depicted herein may be carried out in one or more separate acts and/or phases. Furthermore, to the extent that the terms "including," "includes," "having," "has," "with," or variants thereof are used in either the detailed description and the claims, such terms are intended to be inclusive in a manner similar to the term "comprising." The term "at least one of" is used to mean one or more of the listed items can be selected. Further, in the discussion and claims herein, the term "on" used with respect to two materials, one "on" the other, means at least some contact between the materials, while "over" means the materials are in proximity, but possibly with one or more additional intervening materials such that contact is possible but not required. Neither "on" nor "over" implies any directionality as used herein. The term "conformal" describes a coating material in which angles of the underlying material are preserved by the conformal material. The term "about" indicates that the value listed may be somewhat altered, as long as the alteration does not result in nonconformance of the process or structure to the illustrated embodiment. Finally, "exemplary" indicates the description is used as an example, rather than implying that it is an ideal. Other embodiments of the present teachings will be apparent to those skilled in the art from consideration of the specification and practice of the disclosure herein. It is intended that the specification and examples be considered as exemplary only, with a true scope and spirit of the present teachings being indicated by the following claims.

Terms of relative position as used in this application are defined based on a plane parallel to the conventional plane or working surface of a workpiece, regardless of the orientation of the workpiece. The term "horizontal" or "lateral" as used in this application is defined as a plane parallel to the conventional plane or working surface of a workpiece, regardless of the orientation of the workpiece. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the workpiece, regardless of the orientation of the workpiece.

The invention claimed is:

1. A microwave device, comprising:
   a printed circuit board structure, comprising:
      a printed circuit board substrate having a circuit side, wherein the printed circuit board substrate has a footprint that encloses an area of 0.5 square feet or larger;
      a first conductive line and a second conductive line separated from the first conductive line by a space, wherein the first conductive line and the second conductive line are formed on the printed circuit board substrate; and
      a first microwave device subcircuit on the circuit side of the printed circuit board substrate, wherein the first microwave device subcircuit is configured to transmit and receive signals below a predetermined frequency but not above the predetermined frequency;
   a first passive microwave device attached to the printed circuit board structure and having a footprint that encloses an area of 5 square millimeters or less, wherein the first passive microwave device comprises a resonator and further comprises:
      a first microdevice substrate comprising a semiconductor layer having a passive layer side; and
      a second microwave device subcircuit on the passive layer side of the first microdevice substrate, wherein the resonator does not include active circuitry and further does not include active devices;
   a second passive microwave device attached to the printed circuit board structure, wherein the second passive microwave device is laterally-offset from the first passive microwave device, and wherein the second passive microwave device has a footprint that encloses an area of 5 square millimeters or less and comprising:
      a second microdevice substrate comprising a semiconductor layer having a passive layer side; and
      a third microwave device subcircuit on the passive layer side of the second microwave device substrate, wherein the second and third microwave device subcircuits have smaller line widths, tighter tolerances, and a lower surface roughness than the first microwave device subcircuit, enabling the second and third microwave device subcircuits to transmit and receive signals above the predetermined frequency, wherein the third microwave device subcircuit does not include active circuitry and further does not include active devices, and wherein the third microwave device subcircuit is different from the first and second microwave device subcircuits; and
   an electrical conductor that electrically couples the resonator to the first conductive line and to the second conductive line across the space, and thereby electrically couples the first microwave device subcircuit to the second microwave device subcircuit.

2. The microwave device of claim 1, wherein the first microwave device subcircuit comprises a first device selected from the group consisting of a filter, a capacitor, an inductor, an impedance transformer, an impedance tuning element, a phase shifter, a power divider, a power coupler, and an air bridge structure.

3. The microwave device of claim 2, wherein:
   the first microwave device subcircuit has a minimum feature dimension of from 25 micrometers to 1,000 micrometers; and the second microwave device subcircuit has a minimum feature dimension of from 10 nanometers to 25 micrometers.

4. The microwave device of claim 1, wherein the electrical conductor comprises a material selected from the group consisting of solder and a heat-curable conductive paste.

5. The microwave device of claim 1, wherein the predetermined frequency is 44 GHz or greater.

6. The microwave device of claim 1, wherein:
the printed circuit board substrate comprises a dielectric resin; and
the microdevice substrate comprises a semiconductor.

7. The microwave device of claim 1, wherein the microdevice substrate further comprises a reverse side opposite the passive layer side, and the microwave device further comprises:
a plurality of through-holes through the microdevice substrate that extend from the passive layer side to the reverse side; and
a plurality of conductive plugs, wherein:
each of the plurality of conductive plugs is within one through-hole of the plurality of through-holes; and
the electrical conductor is electrically coupled with each conductive plug of the plurality of conductive plugs.

8. The microwave device of claim 1, wherein:
the printed circuit board structure comprises at least one transistor as an active device; and
the resonator is free from transistors and other active devices.

9. The microwave device of claim 1, wherein the resonator does not include impurity doping.

10. A method for forming a microwave device, comprising:
forming a printed circuit board substrate having:
a footprint that encloses an area of 0.5 square feet or larger,
a circuit side, and
a first microwave device subcircuit on the circuit side, wherein the first microwave device subcircuit is formed by a printed circuit board fabrication technique that enables the first microwave device subcircuit to transmit and receive signals below a predetermined frequency but not above the predetermined frequency;
attaching a first passive microwave device to the first microwave device subcircuit, wherein the first passive microwave device has a footprint that encloses an area of 5 square millimeters or less, wherein the first passive microwave device comprises a resonator, and wherein the first passive microwave device comprises:
a first microdevice substrate comprising a semiconductor layer having a passive layer side, and
a second microwave device subcircuit on the passive layer side of the first microdevice substrate;
attaching a second passive microwave device to the first microwave device subcircuit, wherein the second passive microwave device has a footprint that encloses an area of 5 square millimeters or less, and wherein the second passive microwave device comprises:
a second microdevice substrate comprising a semiconductor layer having a passive layer side, and
a third microwave device subcircuit on the passive layer side of the second microwave device substrate, wherein the second and third microwave device subcircuits have smaller line widths, tighter tolerances, and a lower surface roughness than the first microwave device subcircuit, enabling the second and third microwave device subcircuits to transmit and receive signals above the predetermined frequency, wherein the second and third microwave device subcircuits do not include active circuitry and further do not include active devices, and wherein the third microwave device subcircuit is different from the first and second microwave device subcircuits.

11. The method of claim 10, further comprising selecting the first microwave device subcircuit to comprise a first device selected from the group consisting of a filter, a capacitor, an inductor, an impedance transformer, an impedance tuning element, a phase shifter, a power divider, a power coupler, and an air bridge structure.

12. The method of claim 10, further comprising:
forming the first microwave device subcircuit to comprise a minimum feature dimension of from 25 micrometers to 1,000 micrometers; and
forming the second microwave device subcircuit to comprise a minimum feature dimension of from 10 nanometers to 25 micrometers.

13. The method of claim 11, further comprising selecting the third microwave device subcircuit to comprise a third device, wherein:
the third device is selected from the group consisting of a filter, a capacitor, an inductor, an impedance transformer, an impedance tuning element, a phase shifter, a power divider, a power coupler, and an air bridge structure; and
the third device is different from the first device.

14. The method of claim 10, wherein the predetermined frequency is 44 GHz or greater.

15. The method of claim 10, further comprising:
selecting the printed circuit board substrate to comprise a dielectric resin; and
selecting the microdevice substrate to comprise a semiconductor.

16. The method of claim 10, wherein the microdevice substrate further comprises a reverse side opposite the passive layer side, and the method further comprises:
forming a plurality of through-holes through the microdevice substrate that extend from the passive layer side to the reverse side;
forming a plurality of conductive plugs within the plurality of through-holes; and
electrically coupling the plurality of conductive plugs to the first microwave device subcircuit using the electrical conductor.

17. The method of claim 11, wherein the second passive microwave device is laterally-offset from the first passive microwave device on the first microwave device subcircuit.

18. The method of claim 11, wherein the printed circuit board substrate is made from wood.

* * * * *